United States Patent [19]

Palmisano

[11] 4,118,861
[45] Oct. 10, 1978

[54] REMOVABLE ENCAPSULANT FOR PROTECTION OF ELECTRONIC EQUIPMENT

[75] Inventor: Rocco Richard Palmisano, Bethesda, Md.

[73] Assignee: The United States of America as represented by the Secretary of the Army, Washington, D.C.

[21] Appl. No.: 656,050

[22] Filed: Feb. 6, 1976

[51] Int. Cl.² .......................................... H01B 19/00
[52] U.S. Cl. ...................................... 29/631; 29/627; 174/52 PE; 264/112; 264/272
[58] Field of Search ................... 264/45, 51, 140, 145, 264/112, 272, 297; 29/588, 592, 627; 260/255; 357/75; 174/52 PE

[56] References Cited

U.S. PATENT DOCUMENTS

| 2,897,252 | 7/1959 | Martin | 174/52 PE |
| 3,001,105 | 9/1961 | Fox | 174/52 PE |
| 3,677,981 | 7/1972 | Wada et al. | 260/2.55 |

FOREIGN PATENT DOCUMENTS 1,465,708  5/1969  Fed. Rep. of Germany ...... 174/52 PE 47-6,186  2/1972  Japan .............................. 29/627

OTHER PUBLICATIONS

Modern Plastics Encyclopedia for 1961, 9-1963, vol. 41, No. IA., pp. 360-362, "Foamed Plastics (foamed silicones)".
Kirkwood & Key, Electronics, "Aluminia Powder for Potting: It Pours", 12-1959, pp. 92 & 94.

Primary Examiner—Jan H. Silbaugh
Attorney, Agent, or Firm—Nathan Edelberg; Robert P. Gibson; Saul Elbaum

[57] ABSTRACT

A method of providing an easily removable encapsulant for electronic circuit assemblies is disclosed. According to the method, a body of a suitable inexpensive, low density, foamed silicone rubber which is environmentally and electrically stable is divided into pellets or fine particles. The pellets or particles are poured into a circuit assembly housing to fill voids between the housing and the circuit assembly itself. Since the encapsulating material does not adhere to the circuit assembly or the housing and retains its particulate character in use, it may be removed by simply pouring it out of the circuit assembly housing when desired.

3 Claims, 3 Drawing Figures 4,118,861

REMOVABLE ENCAPSULANT FOR PROTECTION OF ELECTRONIC EQUIPMENT

RIGHTS OF THE GOVERNMENT

The invention described herein may be manufactured, used and licensed by or for the United Stated Government for governmental purposes without the payment to me of any royalty thereon.

BACKGROUND OF THE INVENTION

1. Field of the Invention

The present invention relates generally to a method of encapsulating electronic circuits, and more particularly to a method of encapsulating electronic circuits with an easily removable material.

2. Description of the Prior Art

In many environments it is desirable to encapsulate sophisticated electronic circuitry to prevent it from being damaged by excessive shock or vibration. A good example of such a situation is found in the sophisticated electronic fuse circuit boards carried by modern missiles and artillery shells. Such circuit boards are subjected to intensive accelerating and decelerating shocks as well as substantial in-flight vibrations. Accordingly, it has been the practice in the past to encapsulate these circuits to prevent failure due to the effects of shock and vibration.

In the past epoxies and foamed polyurethanes have been widely used as encapsulants for electronic circuits. When molded around circuit board assemblies and allowed to cure to a rigid state, these materials offer effective protection from the effects of shock and vibration by limiting excessive motion of the boards, components on the boards and electrical connections. However, once a subassembly or complete system is "potted" or encapsulated in a rigid material of the types mentioned, repairs and modifications to the circuit or system become extremely difficult and costly in view of the need to burrow into or remove the encapsulant. Furthermore, circuit assemblies are often damaged when an attempt is made to remove rigid encapsulants for the purpose of servicing or modifying the circuits.

A need therefore exists for an improved encapsulant which is effective in significantly reducing or eliminating the effects of vibration and shock on circuit components, and yet which may be easily removed from circuits or electronic systems to permit them to be serviced, modified, or otherwise processed with ease.

SUMMARY OF THE INVENTION

Accordingly, one object of the present invention is to provide a novel technique for isolating electrical circuits and other components from the effects of vibration or shock.

Another object of the present invention is the provision of a novel method for providing a removable encapsulant to protect electronic circuits and other components from the effects of shock and vibration.

A still further object of the present invention is the provision of a method for encapsulating electronic components and other elements in a solid particulate material having vibration and shock absorbing properties.

Briefly, these and other objects of the invention are provided by the technique of utilizing silicone rubber pellets or granules packed into electronic subassemblies so as to surround circuit boards or components which might be sensitive to shock or vibration. The unique properties of the silicone material provide extensive attenuation of the effects of shock and vibration, and yet provide a re-usable encapsulant which can easily be removed from circuit boards or electronic subassemblies to permit them to be modified, repaired, or otherwise processed.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
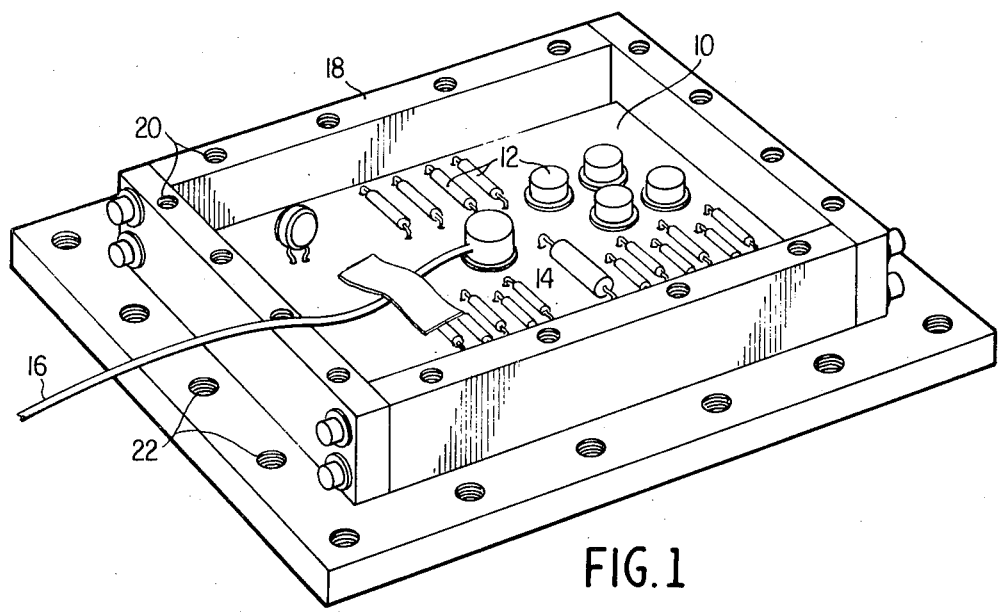
FIG. 1 is an illustration of a circuit board assembly in a vibration fixture without restraining pellets.

Referring now to the drawings, wherein like reference numerals designate identical or corresponding parts throughout the several views, and more particularly to FIG. 1 thereof, an exemplary circuit board for testing is identified by the reference numeral 10. A plurality of circuit components 12 are shown mounted on the circuit board 10, and are connected together to form an operative circuit by means of a conventional printed circuit pattern (not shown). Although the components 12 are illustrated as discrete components such as transistors, resistors and capacitors, it will be apparent to those skilled in the art that other components including all forms of integrated circuits and mechanical elements could equally well be mounted to the circuit board 10. The specific circuit board illustrated is a Packard-Bell Schmidt trigger board, having a size of approximately 2.75 inches by 4 inches, an average weight distribution of 0.01 pounds per square inch and a total weight of 0.11 pound.

A conventional miniature accelerometer 14, such as a Wilcoxin model 103 having a charge sensitivity of 8.59 pC/g is securely mounted to approximately the center of the circuit board 10 for measuring the response of the circuit board to shock and vibration. The accelerometer includes an output lead 16 for supplying the accelerometer response to conventional amplification and recording equipment (not shown) where the response of the circuit board to vibration can be graphically displayed and monitored.

The circuit board 10 is securely mounted within a vibration test housing 18 having, for example, ⅜ inch-thick aluminum walls, lid and base. In FIG. 1 the test housing is illustrated with the lid plate removed. A plurality of threaded mounting holes 20 are provided around the periphery of the upper surface of the walls of the test housing to permit the lid plate (not shown) to be securely mounted in place by threaded fasteners such as screws, or the like. Similarly, a plurality of mounting appertures 22 are formed around the base of the test housing to permit the test housing to be mounted to a shaker for subjecting the circuit board to vibrations at controlled frequencies. The shaker (not shown) may be a conventional device such as a MB-Gilmore model C-90 shaker having a 2 g peak sinusoidal vibration and capable of a 1 decade/min sweep from 10 Hz to 2 KHz. Clearly, other conventional types of shakers may also be used to evaluate the vibration damping material of the present invention.

Figure 2:
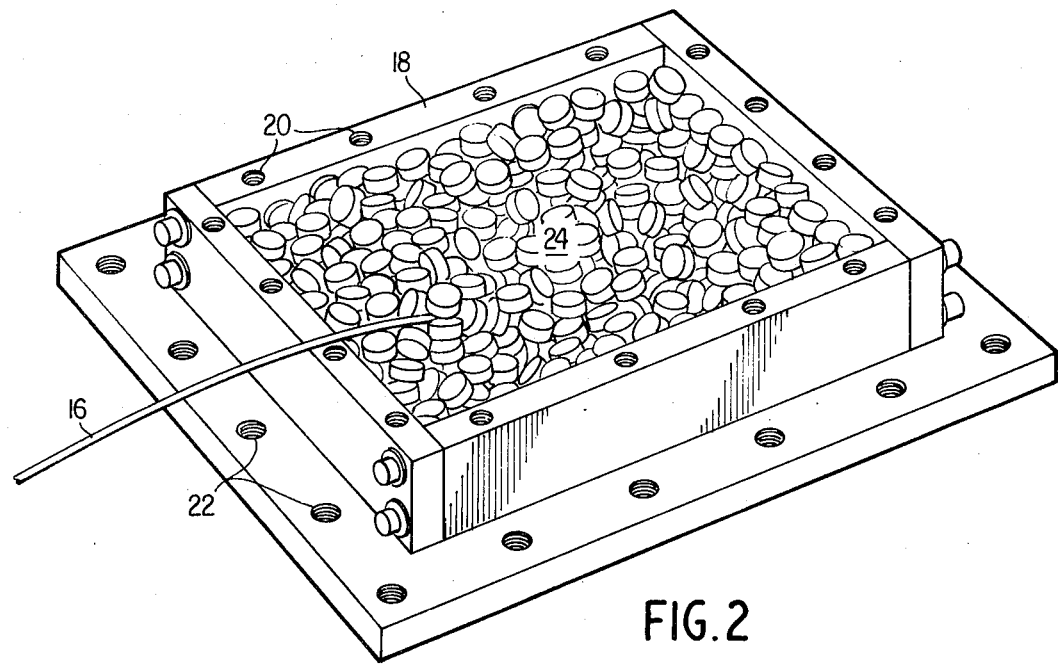
FIG. 2 is an illustration of a circuit board assembly in the vibration fixture of FIG. 1 with restraining pellets; and, FIG. 3 is a graphical illustration showing the response of circuit boards with and without restraining pellets.

Attention is now directed to FIG. 2 which illustrates the test housing 18 of FIG. 1 with the circuit board 10 mounted in place and covered by the removable encapsulant 24 of the present invention.

The removable encapsulant shown in FIG. 2 is in the form of pellets of approximately 3/16 inch diameter, although as will be explained subsequently, the precise shape and size of the encapsulant particles is not critical.

The selection of the material used to form the removable encapsulant is significant since the material of which the encapsulant is comprised must possess a number of physical and chemical properties if it is to be truly successful as an encapsulant which retains its properties over a wide range of physical conditions. The encapsulant material must be chemically inert and must not decompose or initiate corrosion. It must also have a long shelf life. The material must be insensitive to wide temperature ranges, and must maintain its properties at both extremely low and extremely high temperatures. The encapsulant material must also have a characteristically low particle cohesion, and the adhesion to circuitry, circuit board and container should be negligible. The material must also be a good vibration damper and must be able to mitigate the motion of parts over a wide range of vibration frequencies and amplitudes. The compound must be electrically inert and must not effect or influence circuit operation. This requires a high dielectric strength, low dielectric constant, high insulation breakdown voltage, high resistivity and a low dissipation factor. The encapsulant material must also be light in weight to the extent that it does not significantly increase the total weight of the circuit board package. The encapsulant material must also have a low absorptivity to the extent that it absorbs substantially no moisture. Finally, it is desirable that the cost of the material be small relative to the cost of the components or elements being encapsulated.

These properties are possessed by certain silicone foam rubber (polymer) materials; e.g., one resulting from the following chemical reaction:

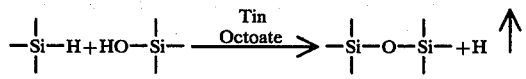

A prepolymer of the material consisting of a silane

plus a silanol

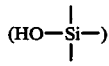

structure react in the presence of the catalyst, tin octoate, as noted above; i.e.: The silanic hydrogen and the hydroxyl group in the polymer react in the presence of the catalyst to form a siloxane chain

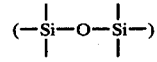

with hydrogen (H$_2$) released. The hydrogen serves as a blowing agent and is instrumental in foaming the silicone polymer. A weak base such as amine is included to neutralize any free acid that may be present.

Typical, commercially available products that have been found to possess the aforementioned essential properties are Dow Corning RTV90-224, Emerson and Cumming Eccofoam SIL, and a silicone "spaghetti" made by Moldit Corporation.

The materials mentioned may be obtained in the form of long, thin strands (i.e., "spaghetti") which are cut into pellets of the type illustrated in FIG. 2. Alternatively, blocks of material can be obtained and ground into particles of random size and shape (similar to sawdust) by the use of a conventional grinding apparatus such as a meat grinder. The precise size and shape of the particles is not critical, as long as the particles are sufficiently small to fall into voids in the enclosed electronic package so as to adequately surround the circuit board to be encapsulated.

Referring again to FIG. 2, the use of the removable encapsulant according to the present invention will now be described in more detail. The encapsulating material, once ground or cut up into suitable particles is poured into the test housing 18 so as to substantially fill the test housing. It is noted that simply filling the test housing is adequate for vibration damping when using the material of the present invention. Over filling the container with encapsulant-particles, even up to 33%, with the result that the encapsulant material is compressed when the lid is secured to the test housing, produces only a very small improvement in vibration damping.

As noted previously, the shape and size of the particles of encapsulant material is essentially irrelevant. Thus, grinding of large blocks of the encapsulant material into arbitrarily sized and shaped particles is totally satisfactory for the purposes of the present invention.

Figure 3:
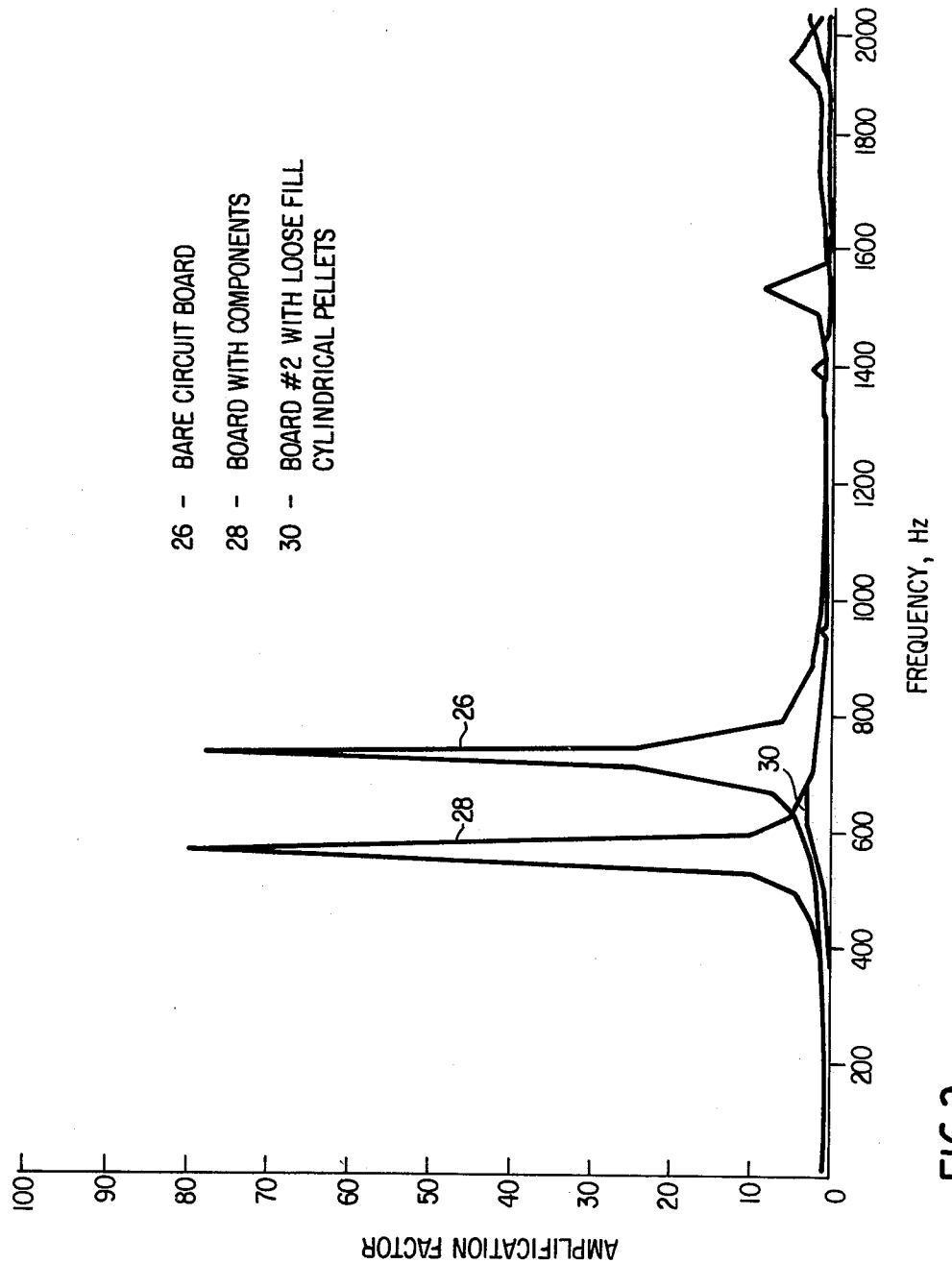

In testing the effectiveness of the removable encapsulant of the present invention in reducing the effects of vibration and shock, the test housing, as illustrated, was secured to a shaker of the type described above and shaken at frequencies up to 2 KHz. As shown in FIG. 3, tests were made with a bare circuit board without encapsulating material, a circuit board with components but without encapsulating material, and a circuit board with components and with encapsulating material. More particularly, FIG. 3 illustrates the vibration frequency along its horizontal axis and amplification factor along its vertical axis. The amplification factor is the ratio of output to input acceleration of the board, as measured by the miniature accelerometer 14. In FIG. 3 the peak 26 represents a circuit board with no components and without incapsulating material, showing an amplification factor of approximately 75 at a frequency of approximately 750 Hz. Similarly, the response of a circuit board with components but without any encapsulating material is shown by the peak 28 as having an amplification factor of approximately 80 at a frequency of approximately 575 Hz. The curve 30 represents the response of a circuit board with components (i.e., the worst case) surrounded by encapsulating material according to the present invention. As is shown by the curve, the amplification factor is reduced from approximately 80 to approximately 3, a very substantial reduction in vibration response.

Testing of the removable encapsulant of the present invention revealed that it greatly reduced the sensitivity of circuit boards to shock and vibration, and yet provided the great advantage of being easily removable and reusable. Thus, after circuit boards are encapsulated, as described above, the lid may simply be removed from the test housing and the encapsulating pellets or particles may simply be poured out to permit immediate and unhendered access to the original circuit board. Modifications can be made to the circuit board and the encapsulating material can then be replaced with little difficulty or complication. This convenience of access combined with significant shock and vibration reducing propensities provides a great advantage in the assembly of ordnance fuzes, and in many other similar environments in which electronic units must be assembled and encapsulated to reduce the effects of shock or vibration, and yet may be subject to occasional modifications or improvements. In such instances, modifications to devices encapsulated using conventional hard materials is not feasible, resulting in substantial economic wastes and inefficiencies due to the need for complete replacement of the units. However, the present invention permits the encapsulant to be removed with ease, so that modifications to existing circuits can be made, providing significant economic benefits and cost savings.

I wish it to be understood that I do not desire to be limited to the exact details of construction shown and described, for obvious modifications can be made by a person skilled in the art.

What is claimed as new and desired to be secured by Letters Patent of the United States is:

1. A new use for silicone rubber, formed from the reaction of a prepolymer comprising a silane and silanol in the presence of a catalyst, as a removable encapsulent for electronic equipment comprising the steps of:

dividing a body formed of said silicone rubber into pellets;

pouring said pellets of silicone rubber material into a housing containing electrical equipment so as to fill the voids between said housing and said electrical equipment; and, enclosing said housing to prevent said silicone rubber pellets from falling out of said housing; thereby, surrounding said electronic equipment with said pellets so as to substantially reduce the sensitivity of said electronic equipment to shock and vibration without significantly increasing the total weight of said equipment.

2. A method as in claim 1 wherein said step of forming comprises the step of:

grinding a body of silicone material into pellets of irregular shape and size.

3. A method as in claim 1 wherein said step of forming comprises the step of:

cutting elongated strands of silicone material into pellets of generally regular size.

* * * * *